US008780512B2

(12) United States Patent
Sullivan

(10) Patent No.: US 8,780,512 B2
(45) Date of Patent: Jul. 15, 2014

(54) LOW LEAKAGE ESD STRUCTURE FOR NON-CONTACT BIO-SIGNAL SENSORS

(75) Inventor: Thomas J. Sullivan, San Diego, CA (US)

(73) Assignee: NeuroSky, Inc., San Jose, CA (US)

( * ) Notice: Subject to any disclaimer, the term of this patent is extended or adjusted under 35 U.S.C. 154(b) by 102 days.

(21) Appl. No.: 13/430,564

(22) Filed: Mar. 26, 2012

(65) Prior Publication Data
US 2012/0250197 A1 Oct. 4, 2012

Related U.S. Application Data

(60) Provisional application No. 61/470,984, filed on Apr. 1, 2011.

(51) Int. Cl.
H02H 9/00 (2006.01)
H01C 7/12 (2006.01)
H02H 1/00 (2006.01)
H02H 1/04 (2006.01)
H02H 3/22 (2006.01)
H02H 9/06 (2006.01)

(52) U.S. Cl.
USPC .............................. 361/56; 361/118

(58) Field of Classification Search
USPC .................... 361/56, 118
See application file for complete search history.

(56) References Cited

U.S. PATENT DOCUMENTS

| 5,563,757 | A | 10/1996 | Corsi | |
|---|---|---|---|---|
| 5,764,464 | A * | 6/1998 | Botker et al. | 361/56 |
| 7,315,438 | B2 * | 1/2008 | Hargrove et al. | 361/56 |
| 7,489,125 | B2 | 2/2009 | Hauptman | |
| 7,518,844 | B1 | 4/2009 | Xu et al. | |
| 7,639,463 | B2 * | 12/2009 | Steinhoff et al. | 361/56 |
| 2003/0102923 | A1 | 6/2003 | Vathulya et al. | |
| 2007/0091526 | A1 * | 4/2007 | Steinhoff et al. | 361/56 |
| 2009/0141413 | A1 * | 6/2009 | Carroll et al. | 361/56 |
| 2011/0038083 | A1 * | 2/2011 | Coln et al. | 361/54 |
| 2011/0043225 | A1 * | 2/2011 | Sullivan et al. | 324/658 |
| 2012/0162836 | A1 * | 6/2012 | Furuta et al. | 361/56 |

OTHER PUBLICATIONS

Gerard C.M. Meijer, Smart Sensor System, John Wiley & Sons, Ltd. 2008.
Eilhard Haseloff, Latch up, ESD, and Other Phenomena, Texas Instrument, May 2010.

* cited by examiner

Primary Examiner — Dharti Patel
(74) Attorney, Agent, or Firm — Van Pelt, Yi & James LLP

(57) ABSTRACT

Various techniques for providing a low leakage electrostatic discharge (ESD) structure for non-contact bio-signal sensors are disclosed. In some embodiments, a low leakage ESD structure for a capacitive bio-sensor includes a unity gain buffer, and an ESD protection circuit connected to the unity gain buffer, in which the ESD protection circuit includes a diode connected across an input and an output of the unity gain buffer, and in which a voltage range for the ESD protection circuit is configurable.

15 Claims, 3 Drawing Sheets

LOW LEAKAGE ESD STRUCTURE FOR NON-CONTACT BIO-SIGNAL SENSORS

CROSS REFERENCE TO OTHER APPLICATIONS

This application claims priority to U.S. Provisional Patent Application No. 61/470,984 entitled LOW LEAKAGE ESD STRUCTURE filed Apr. 1, 2011 which is incorporated herein by reference for all purposes.

BACKGROUND OF THE INVENTION

Non-contact bio-signal sensors (e.g., electroencephalography (EEG) sensors) exist for various medical, biofeedback, entertainment, and/or other applications and uses. For example, non-contact bio-signal sensors can be used in various applications that otherwise may have required the use of wet electrodes (e.g., gel based or other forms of wet electrodes).

BRIEF DESCRIPTION OF THE DRAWINGS

Various embodiments of the invention are disclosed in the following detailed description and the accompanying drawings.

DETAILED DESCRIPTION

Figure 1A:
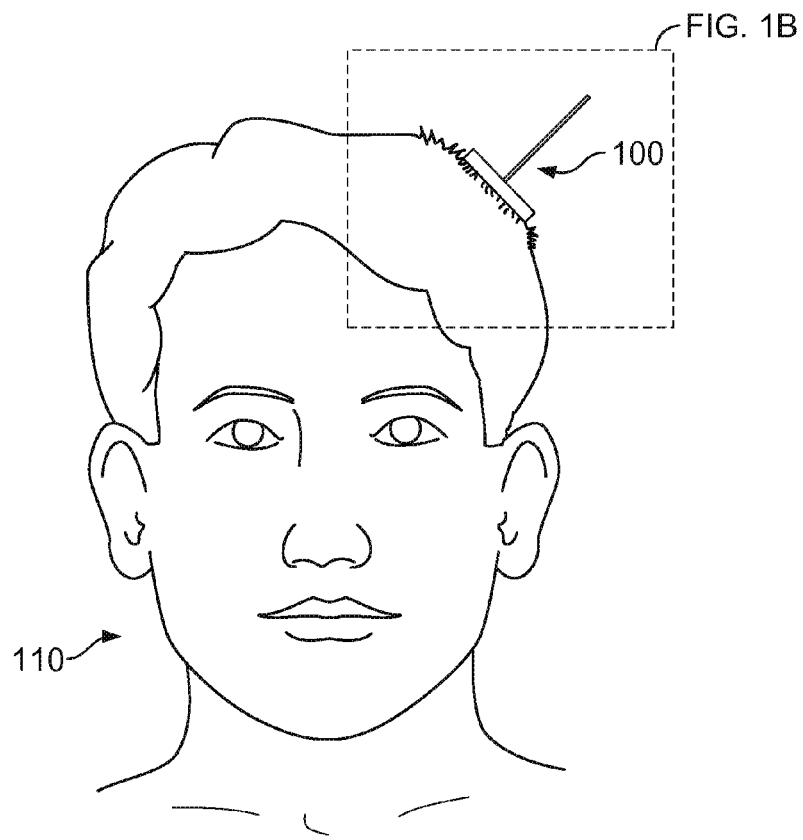
FIGS. 1A and 1B are an illustration of an example of a non-contact bio-signal sensor being used to capture EEG signals from a user's head in accordance with some embodiments.

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Non-contact bio-signal sensors exist for various medical, biofeedback, entertainment, and/or other applications and uses. Non-contact bio-signal sensors can be used to pick up various bio-signals of a user, for example, electroencephalography (EEG) signals and ECG (electrocardiography) signals. Particularly in applications in which it would be a nuisance or unwanted to use wet electrodes (e.g., gel based or other forms of wet electrodes), non-contact bio-signal sensors can be used in gaming, consumer, or commercial applications. Also, non-contact bio-signal sensors are also useful for areas in which it would be difficult to obtain direct contact with the user's skin, such as where there is hair on top of a user's head.

Non-contact bio-signal sensors use a capacitive element (i.e., an electrode), typically a conductive disk, placed above the user's skin. Changes in voltages under the area where the capacitive plate caused by brain waves or electrical impulses that cause muscle contractions are picked up by the electrode as a bio-signal. In contact bio-signal sensors, the desired signal is picked up with an electrode in direct contact with the user's skin and typically with a conductive gel or a pad soaked in conductive liquid, to provide a low resistance conductive path through the skin to the sensor circuitry. Some contact bio-signal sensors use pins or screws that pierce the skin to provide a better contact with the source of the bio-signals. In general, non-contact bio-signal sensors have typically provided poorer signal quality than contact bio-signal sensors.

Additionally, because non-contact bio-signal sensors are capacitive, and there is no path for conduction of a current, they have very high input resistance. This high resistance causes difficult constraints on the amplifier in the sensor circuitry typically connected to a bio-sensor. Even small amounts of current noise produced at the input of the amplifier will typically be converted to large voltage noise (e.g., Kirchoffs V=IR equation reveals this relationship). This high resistance or impedance also limits what other loads can be connected to non-contact bio-signal sensor.

Also, EEG signals have a low peak-to-peak voltage and, thus, any noise degrades the signal quality greatly. Typically, an EEG signal has a peak-to-peak voltage of 20 µV to 100 µV. Typical ECG signals have even lower peak-to-peak signals of 1 mV. EEG signals have a frequency that range from 0 to 100 Hz, rarely going above 100 Hz.

Another design challenge for contactless biosignal sensors is that ElectroStatic Discharge (ESD) protection is needed. ESD is a common concern for any electrical circuit, particularly integrated circuits, as small surges in voltage from the outside (of the integrated circuit) can damage the circuit. A typical source of ESD is from the human body. ESD tests and standards are built around the model of a human discharging built up electrostatic charge. For instance, a human walking across a carpet depending on the humidity and the clothes the human wears can discharge a built up charge up to 30 kV. ESD events or ESD discharges can be negative and positive surges in voltage. Particularly in applications interfacing with the human body frequently, it would be greatly beneficial to have ESD protection circuits with the EEG or ECG biosensors.

When non-contact bio-signal sensors are used to record EEG signals, the dominant source of noise in the sensor circuitry can be due to current noise at the input of the amplifier, which is part of the sensor circuitry. This is called input referred noise. Current noise at an amplifier input is generally caused by leakage current from any circuit that is in contact with the input. For example, the gate leakage of input transistors (i.e., in CMOS technology) can be a contributor of such leakage current. Currently available transistors on a CMOS process can have low current leakage characteristics. However, typical ESD structures used with CMOS transistors produce too much leakage current to the current noise at the amplifier input and ultimately to the level of noise in the system. A range of low uA's of leakage current is generally too high for many bio-signal applications. Low uA's of leakage current is currently about one million times too high for various bio-signals, like EEG-type applications. Other low leakage ESD structures may be in the nA range, which is still too high for many bio-signal applications. As a result, typical ESD structures can dominate the leakage current at the amplifier input of bio-signal sensor circuits.

On the other hand, in order to reduce noise in the bio-signal sensor system overall, various commercial amplifiers with low bias current noise are available. Some commercial amplifiers use fabrication techniques to lower leakage current by locating the silicon transistors in insulated wells, in which the input transistors are large geometry junction field effect transistors (JFETs). However, such commercial amplifiers generally require less ESD protection (if any), are very expensive, are relatively large, and require +/−5V supplies.

A high performance commercial amplifier that can be used with a bio-sensor circuitry has a typical leakage current of approximately 3fA (e.g., resulting in input referred current noise of approximately 0.1 fA/sq rt. Hz).

What is needed is an ESD protection circuit with lower leakage current than the leakage current of the commercial amplifier (e.g., so the ESD protection circuitry no longer dominates the leakage current) and that in turn causes lower noise in the system overall. Additionally, it would be beneficial if it were a low-cost and compact solution.

Accordingly, various techniques for low leakage electrostatic discharge (ESD) circuits for a capacitive bio-signal sensor or non-contact bio-signal sensor are disclosed. In some embodiments, the low leakage ESD circuit provides a circuit with lower current noise for improved performance along with ESD protection. For example, the low leakage ESD circuit can be used for capacitive bio-signal sensors or contactless bio-signal sensors for various applications, such as entertainment, medical, or biofeedback applications.

In some embodiments, a low leakage ESD circuit includes a unity gain buffer and a diode connected across an input and an output of the unity gain buffer. The voltage range for the ESD protection circuit is configurable. In some embodiments, the voltage range or the voltages at which ESD protection turns on is configured by adding diodes in the discharge path. In some embodiments, configuration of the voltage range is provided by connecting the discharge paths to different potential sources. The various embodiments disclosed herein of a low leakage ESD structure with lower current noise can be used for various other applications. For example, low leakage ESD structures can be used for various applications, such as a non-contact bio-signal sensor (e.g., an EEG sensor or ECG sensor), a pH-level sensor, or other types of sensors.

Figure 1B:
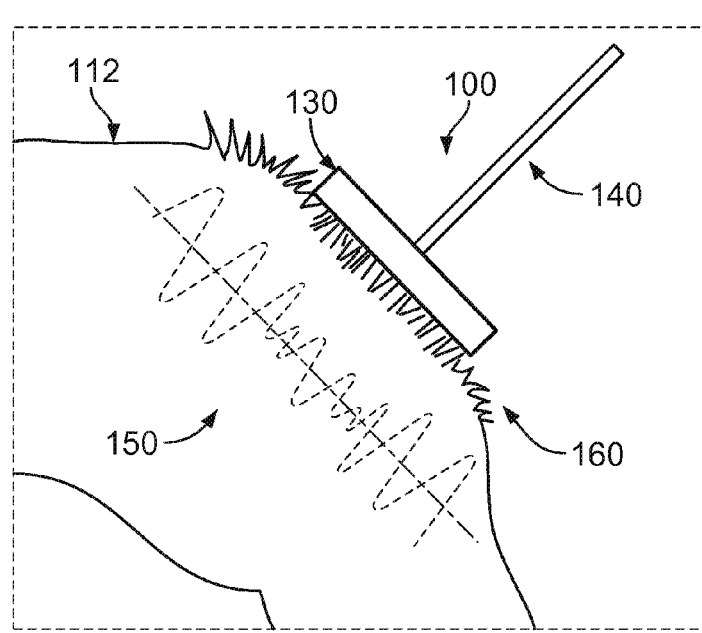

FIGS. 1A and 1B are an illustration of an example of a non-contact bio-signal sensor being used to capture EEG signals from a user's head in accordance with some embodiments. A user's head 110 has a non-contact bio-signal sensor 100 including a conductive plate 130 (e.g., also referred to as an electrode) and connection 140 to sensor circuitry, placed against the user's head 110. In particular, FIG. 1B illustrates the non-contact bio-signal sensor on the user's head with a magnified view. The non-contact bio-signal sensor 100 is a capacitive bio-signal sensor, in which the non-contact bio-signal sensors form a capacitive element between the user's skin 112 and the conductive plate of the sensor 130. A contactless bio-signal sensor is primarily a conductive plate or electrode 130 that is placed over the skin of the user 112. In between the electrode 130 and user's skin 112 is hair 160 or gaps of air (e.g., due to uneven surfaces or even tiny gaps of air between the electrode and the skin) that can serve as an insulator. Changes in voltages over the area of the electrode 130 (e.g., caused by brainwaves 150, referred to as EEG signals) are then picked up by the sensor circuitry connected to the electrode through connection 140.

The capacitive bio-sensor 100 is particularly useful for easy contact with portions of a user's head where there is hair, without the nuisance of gels or conductive liquids. In some embodiments, the capacitive sensor 100 is placed on the skin of the user's face or forehead or another appropriate position on the user's head. The capacitive bio-signal sensor is also known as a dry electrode that does not require the use of a conductive gel or wet pad in order to reduce signal path resistance, or pins that will pierce the skin or screw into the skin. In some embodiments, the capacitive bio-signal sensor is placed over areas of the chest of the user in order to pick up ECG (electrocardiography) signals.

Because of the small changes in voltage underneath the surface of the skin caused by firing neurons (e.g., EEG signals) 150 or muscle contractions (e.g., ECG signals) that are picked up by a capacitive element formed by the bio-signal sensor electrode over the skin, there is high source resistance. In non-contact bio-signal sensors, there is no direct path for movement of electrons across the skin barrier like in contact bio-signal sensors. The non-contact bio-signal sensor is modeled by a large capacitor and a resistor with very high resistance, for example, a resistor with Giga-ohms of resistance.

Electrically connected to the capacitive bio-signal sensor 100 is sensor circuitry (not shown). In some embodiments, sensor circuitry includes an amplifier and other circuitry to amplify, temper, filter, and/or process the signals picked up over the input electrode 130, in this case, non-contact bio-signal sensor 100.

Figure 2:
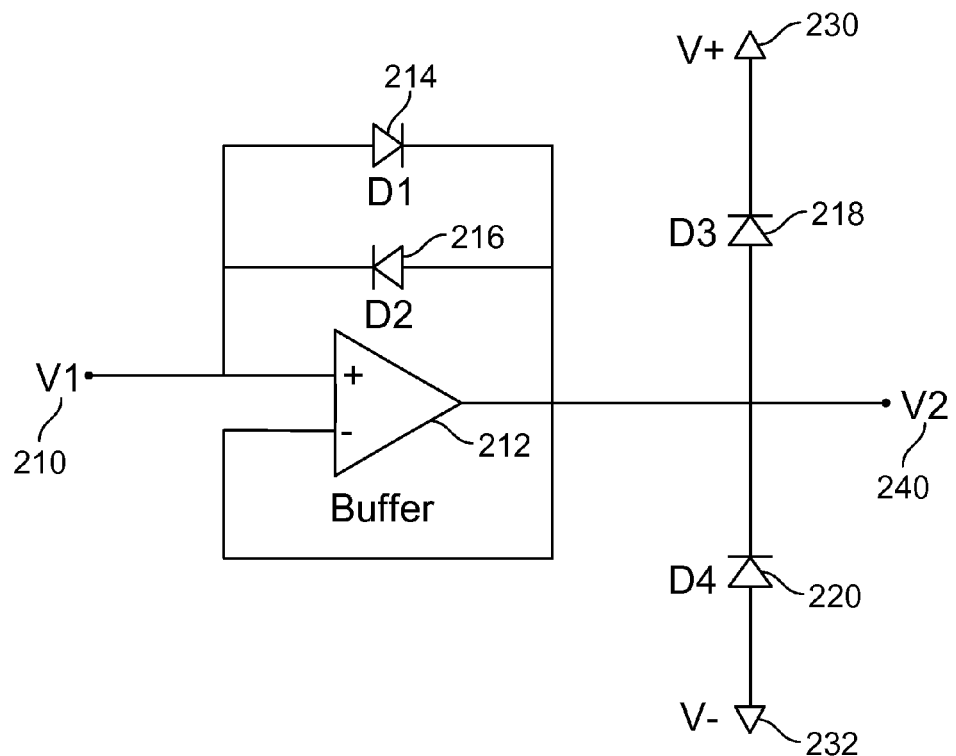
FIG. 2 is a circuit diagram illustrating a low leakage ESD structure for a capacitive bio-signal sensor in accordance with some embodiments.

FIG. 2 is a circuit diagram illustrating a low leakage ESD structure for a capacitive bio-signal sensor in accordance with some embodiments. The low leakage ESD structure can be used in conjunction with sensor circuitry (not shown) that can further amplify, temper, filter, and/or process the input signal (e.g., an EEG signal or ECG signal). As shown, V1 210 is an input pin, where an input voltage is applied. In some embodiments, V1 210 is electrically connected to non-contact bio-signal sensor 100, which includes, for example, electrode 130 and connection 140. V2 240 is the output pin of the low leakage ESD circuit, which can be electrically connected to additional sensor circuitry, or to a processor to transform the analog output signal of the low leakage ESD circuit into a machine intelligible signal (e.g., digital signal) that can be computed/processed for medical, entertainment, or other suitable applications.

ESD structures or circuits generally function by diverting ESD pulses of energy coming across the input/output pins away from sensitive circuitry and into a part of the circuit with a larger capacity to absorb the energy, such as power supplies. In typical ESD circuits, diodes are connected from the input/output pins to the power supplies, like VCC and ground. In contrast, the low leakage ESD protection circuit shown in FIG. 2 includes diodes D1 214 and D2 216 that are connected from input pin 210 to the output of a unity gain buffer (i.e., the same node as V2 240). Diodes D1 214 and D2 216 have inherent on-voltages VonD1 and VonD2, respectively. The power sources or power supplies are a high potential source V+ 230 and a low potential source V− 232. The low leakage ESD circuit uses unity gain buffer 212 to turn the high input impedance of input pin 210, which can be connected to a high impedance capacitive bio-signal sensor, to a lower impedance at output pin V2 240, which can be connected to additional sensor circuitry. The low leakage ESD protection circuit also includes diodes D3 218 and D4 220, with respective on-voltages VonD3 and VonD4.

When the input pin 210 is hit with an ESD event, like a voltage increase or surge or a positive voltage surge, voltage V1 at input pin 210 may rise above high potential source V+ 230. When the increase voltage at the node V1 reaches the two diodes, then D1 214 and D3 218 would turn on (e.g., when voltage surge increases above V+ and the on-voltage of diodes D1 214 and D3 218) emptying the increase voltage into high potential source V+ 230 which has a higher capacity for voltage surges, avoiding damage to the input of buffer 212. Similarly, when an ESD event like a voltage decrease or negative voltage surge, and voltage V1 drops below V− 232, then D2 216 and D4 220, turn on and protect the input of buffer 212.

Typical ESD circuits with a diode connected from the input pin to the power source, have a voltage difference of the input pin and the power source across the diode. Because of that voltage difference, and depending on the on-voltage of the diode, there will be some current that will leak through the diode. The leakage current from the diode in a typical ESD circuit will cause input referred noise, and increase the noise of the system. However, in the low leakage ESD protection circuit shown in FIG. 2, there will be lower leakage, because across the unity gain buffer 212, which has a gain of 1 (unity gain), the voltages at the input V1 210 and output V2 240 are the same, and rise and fall together. Therefore, the voltage across the diodes D1 214 and D2 216 or their respective p-n junctions would be relatively small. As a result, leakage current into the input of buffer 212 from diodes D1 214 and D2 216 is minimized. Accordingly, noise is also lowered, and the low leakage ESD protection circuit shown in FIG. 2 has higher performance. Additionally, the low leakage ESD protection circuit shown in FIG. 2 achieves impedance conversion and ESD protection.

In some embodiments, such lower leakage ESD structures can be used for low frequency applications like detecting bio-signals. At higher frequencies, the diodes across the unity gain buffer would effectively become capacitors and limit higher frequencies. However, EEG signals have a frequency range of 0-100 Hz, which is ideal for the lower leakage ESD structures described herein with respect to various embodiments.

In some embodiments, the unity gain buffer 212 is a CMOS amplifier with unity gain, or a differential CMOS amplifier with unity gain, or is a single-ended CMOS amplifier with additional circuitry like baluns, to transform the signal into a double-ended signal. In some embodiments, the unity gain buffer is fabricated with additional components for trimming the unity gain buffer to further increase the performance of the unity gain buffer and achieve close to unity gain.

In some embodiments, the low leakage ESD circuit of FIG. 2 is a part of the sensor circuitry. In some embodiments, the low leakage ESD circuit is formed on an integrated circuit with the rest of the sensor circuitry. For example, non-contact bio-signals sensors with low leakage ESD structures can be implemented in an ASIC along with a processor for processing the bio-signal. In some embodiments, the low leakage ESD circuit is a separate circuit electrically connected to the capacitive electrode and electrically connected to additional sensor circuitry. The low leakage ESD structure can be formed as separate analog components on a circuit board, or as an integrated circuit. In some embodiments, the low leakage ESD circuit is fabricated on a CMOS process, a digital CMOS process, a mixed signal CMOS process, a low leakage CMOS process, or any appropriate CMOS process. For example, a CMOS process at the 0.18 um node that can provide input transistors with a gate leakage below 3fA can be used to fabricate the low leakage ESD protection circuit.

In the low leakage ESD structure of FIG. 2, the voltage threshold to trigger the ESD protection is the potential source voltage level and the on-voltage of each of the diodes in the discharge path. The two voltage thresholds, one for positive voltage surges and one for negative voltage surges, define the voltage range of the low leakage ESD structure of FIG. 2. In some embodiments, the voltage threshold and, thus, the voltage range can be configured, as further described below.

For example, using a typical EEG application, the voltage power supply sources are typically +3V and −3V, and voltage level of high potential source V+ 230 is +3V and low potential source V− 232 is −3V. The same voltage power supplies are used as the supply voltages of unity gain buffer 212. The voltage range of the low leakage ESD structure of FIG. 2 can be calculated. In this typical EEG application, the input EEG signals coming in on input pin 210 will have a peak-to-peak voltage of 20 mV-100 mV, centered on ground or 0V. Therefore, if the on-voltage of D1 (VonD1) is 0.7V and similarly for diode D3 (VonD2 VonD3 is also 0.7V) and high potential source V+ voltage level is +3V, then the upper voltage threshold that will shunt the ESD event to the high potential source is +4.4V. Accordingly, if the on-voltage of D2 216 (VonD2) is 0.7V and D4 220 (VonD4) is also 0.7V, and low potential source V− 232 is −3V, then the lower voltage threshold that will shunt a negative voltage surge ESD event to the voltage supply is −4.4V. Therefore, the voltage range of acceptable input voltages on input pin 210 is −4.4V to +4.4V in this example.

Figure 3:
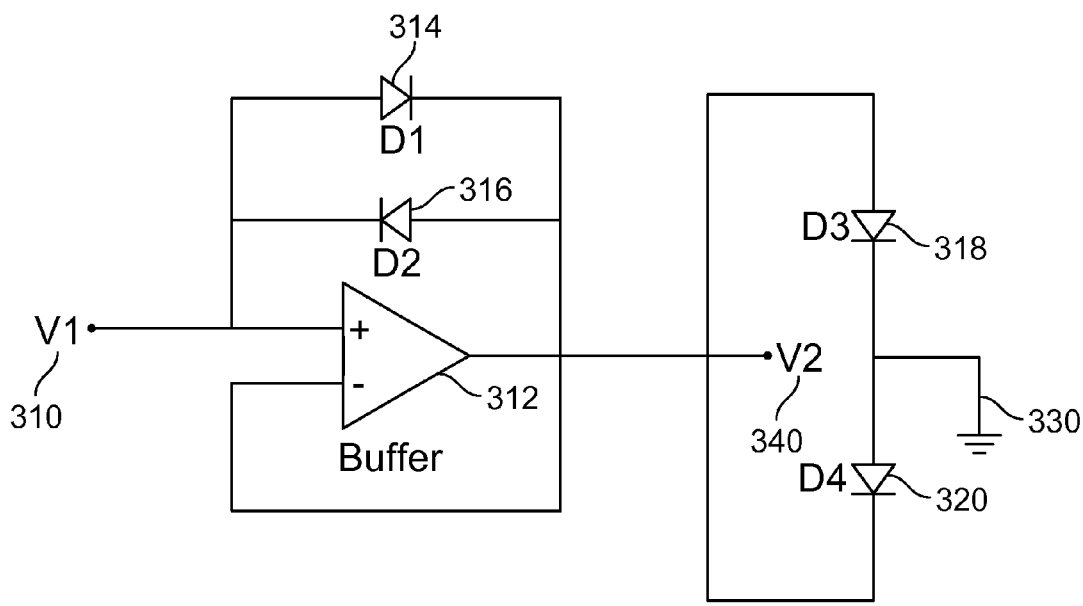
FIG. 3 is a circuit diagram illustrating another low leakage ESD structure in accordance with some embodiments.

FIG. 3 is a circuit diagram illustrating another low leakage ESD structure in accordance with some embodiments. FIG. 3 shows an embodiment where the upper and lower voltage thresholds are configured to be the combined on-voltages of the diodes in the discharge path. The low leakage ESD structure shown in FIG. 3 includes a unity gain buffer 312, input pin 310 and output pin 340, and ESD protection circuit including diodes D1 314 and D3 318 and diodes D2 316 and D4 320, each with an on-voltage. Diodes D1 314 and D2 316 are connected from input pin 310 to the output of buffer 312. Diodes D3 318 and D4 320 are connected from the output of buffer 312 to ground 330. In some embodiments, ground 330 is the mid-point potential between potential sources for the low leakage ESD structure shown in FIG. 3. The upper and lower voltage thresholds are the combined on-voltages of the diodes. For example, if input pin 310 is hit with a positive voltage surge (an ESD event), the input voltage would only have to rise above VonD1+VonD3 (the combined on-voltages of D1 314 and D3 318) to shunt the positive voltage surge to a power supply (in this case, ground). Similarly in this example, the lower voltage threshold is the combined on-voltages of D2 and D4. If the on-voltages of the diodes shown in FIG. 3 are all 0.7 V, the voltage range of low leakage ESD structure shown in FIG. 3 is −1.4V to 1.4V. The low leakage ESD structure of FIG. 3 limits the voltage range, but does not require the ESD event voltage to be above or below the power supplies (the high and low potential source V+ 230 and V− 232 of FIG. 2) to trigger the ESD protection.

Figure 4:
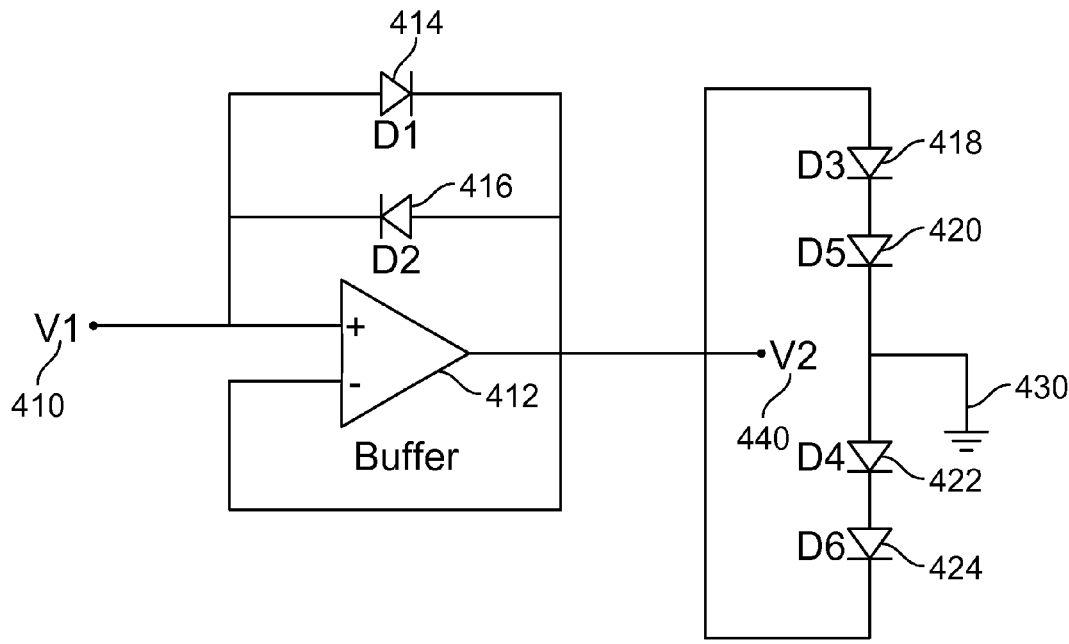
FIG. 4 is a circuit diagram illustrating another low leakage ESD structure in accordance with some embodiments.

FIG. 4 is a circuit diagram illustrating another low leakage ESD structure in accordance with some embodiments. FIG. 4 shows an embodiment where the upper and lower voltage thresholds are configured to be the combined on-voltages of the diodes in the discharge path. The low leakage ESD structure of FIG. 4 comprises input pin 410, unity gain buffer 412, output pin 440, and ESD protection circuit comprising diodes D1 414, D3 418, D5 420 and diodes D2 416, D4 422, and D6 424, each with an on-voltage. Diodes D1 414 and D2 416 are connected from input pin 410 to the output of buffer 412. Diodes D3 418, D4 422, D5 420, and D6 424 are connected from output pin 440 to ground 430. In some embodiments, ground 430 is the mid-point potential between potential sources (i.e., power supplies) for the low leakage ESD structure in FIG. 4.

As shown, the low leakage ESD structure of FIG. 4 includes four diodes D3 418, D4 422, D5 420, and D6 424 instead of two diodes in order to set a wider range for the input voltage. In this example, when input voltage at input pin 410 increases due to an ESD event, three diodes: D1 414, D3 418, and D5 420 will turn on and limit the input voltage from increasing any higher. If input voltage goes too low (i.e., a negative voltage surge), D2 416, D4 422, and D6 424 will limit any further drop. Therefore, the upper voltage threshold is VonD1+VonD3+VonD5 and the lower voltage threshold is VonD2+VonD4+VonD6, and if the on-voltages of each of the diodes in the low leakage ESD structure of FIG. 4 is 0.7V then the voltage range is −2.1V to +2.1V.

Figure 5:
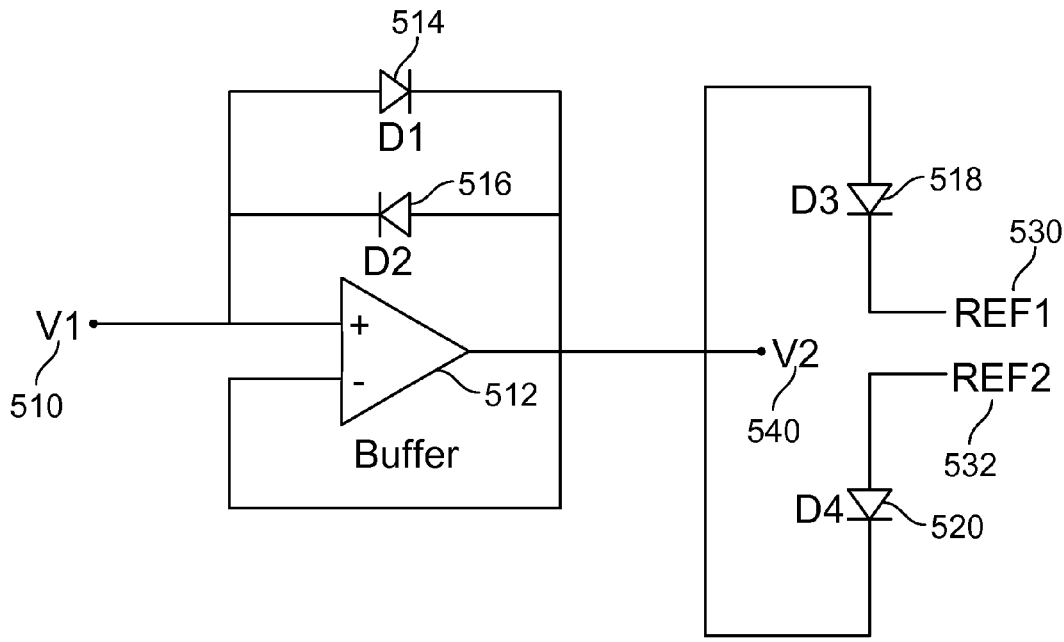
FIG. 5 is a circuit diagram illustrating another low leakage ESD structure in accordance with some embodiments.

FIG. 5 is a circuit diagram illustrating another low leakage ESD structure in accordance with some embodiments. The upper and lower voltage thresholds where the ESD protection circuit engages are set by reference potential REF1 530 and reference potential REF2 532. The low leakage ESD structure of FIG. 5 comprises input pin 510 and output pin 540, unity gain buffer 512, and ESD protection circuit comprising diodes D1 514 and D3 518 and diodes D2 516 and D4 520, each with an on-voltage. Diodes D1 514 and D2 516 are connected from input pin 510 to the output of unity gain buffer 512 (output pin 540). Diode D3 518 is connected from output pin 540 to reference potential REF1 530. Diode [[D5]] D4 520 is connected from output pin 540 to reference potential REF2 532. Similar to the low leakage ESD structure of FIG. 2, the upper threshold for a positive voltage surge as part of an ESD event is now the voltage level of reference potential REF1 530 and the combined on-voltages of diodes D1 514 and D3 518. If the on-voltages of the diodes D1 and D3 are 0.7V and the reference potential REF1 530 is +1V for example, then the upper threshold for a positive voltage surge is +2.4V. Similarly, if diodes D2 516 and D4 520 have on-voltages of 0.7V, and reference potential REF2 532 is −1V for example, then the lower threshold for a negative voltage event is −2.4V. In some embodiments, reference voltages REF1 530 and REF2 532 are set externally. In some embodiments, reference voltages REF1 530 and REF2 532 are on-board or on-chip stepped-down or stepped-up voltages or from any appropriate source.

Diode on-voltages, potential sources, voltages supplies, reference potentials, input voltages, voltage thresholds, voltage ranges, and their values are only by example, and can be at levels or values as chosen by the circuit designer, component chooser/designer or as the process used to fabricate the low leakage ESD structure allows or according to other design constraints, or to get a desired voltage range, as one of ordinarily skill in the art would understand in view of the various embodiments described herein.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A low leakage electrostatic discharge (ESD) circuit for a capacitive bio-sensor comprising:
   a unity gain buffer;
   an ESD protection circuit connected to the unity gain buffer, wherein the ESD protection circuit comprises a first diode and a second diode connected across an input and an output of the unity gain buffer; and
   an electrode connected to the input of the unity gain buffer, wherein the electrode is a non-contact electroencephalography (EEG) sensor or a non-contact electrocardiography (ECG) sensor;
   wherein an anode of the first diode and a cathode of the second diode are directly connected to the electrode;
   wherein:
   a cathode of a third diode and an anode of a fourth diode being connected to a ground, and an anode of the third diode and a cathode of the fourth diode being directly connected to the output of the unity gain buffer; and
   wherein a voltage range for the ESD protection circuit is configurable.

2. The circuit of claim 1, wherein the ESD protection circuit further comprises:
   the first diode and the third diode for directing an increase voltage above an upper threshold of the voltage range of the ESD protection circuit.

3. The circuit of claim 1, wherein the ESD protection circuit further comprises:
   the second diode and the fourth diode for directing a decrease voltage below a lower threshold of the voltage range of the ESD protection circuit.

4. The circuit of claim 1, wherein the ESD protection circuit further comprises:
   the first diode connected across the input and output of the unity gain buffer connected in a direction to direct an increase voltage towards the output of the unity gain buffer;
   the third diode connected from the output of the unity gain buffer to direct an increase voltage to the ground;
   the second diode connected across the input and the output of the unity gain buffer in a direction to direct a decrease voltage towards the output of the unity gain buffer; and
   the fourth diode connected from the output of the unity gain buffer to direct a decrease voltage to the ground.

5. The circuit of claim 1, wherein the ESD protection circuit further comprises:
   the first diode and the third diode for directing an increase voltage above an upper threshold, wherein the upper threshold is adjusted by adding one or more diodes connected with the third diode and in the same direction, to increase a combined on-voltage of the first, third and one or more diodes.

6. The circuit of claim 1, wherein the ESD protection circuit further comprises:
   the second diode and the fourth diode for directing a decrease voltage below a lower threshold, wherein the lower threshold is adjusted by adding one or more diodes connected with the fourth diode and in the same direction, to increase a combined on-voltage of the second, fourth and one or more diodes.

7. The circuit of claim 1, wherein the ESD protection circuit is an integrated circuit made with a CMOS process.

8. The circuit of claim 1, wherein:
a cathode of the first diode is connected to the output of the unity gain buffer; and
an anode of the second diode is connected to the output of the unity gain buffer.

9. The circuit of claim 1, wherein the electrode is connected to a positive input of the unity gain buffer.

10. The circuit of claim 1, wherein a cathode of the first diode and an anode of the second diode are connected to a negative input of the unity gain buffer.

11. A low leakage electrostatic discharge (ESD) circuit for a capacitive bio-sensor comprising:
a unity gain buffer;
an ESD protection circuit connected to the unity gain buffer, wherein the ESD protection circuit comprises a first diode and a second diode connected across an input and an output of the unity gain buffer; and
an electrode connected to the input of the unity gain buffer, wherein the electrode is a non-contact electroencephalography (EEG) sensor or a non-contact electrocardiography (ECG) sensor;
wherein an anode of the first diode and a cathode of the second diode are directly connected to the electrode;
wherein:
a cathode of a third diode and an anode of a fourth diode being connected to a ground, and an anode of the third diode and a cathode of the fourth diode being directly connected to the output of the unity gain buffer, the third and fourth diodes each including a plurality of diodes; and
wherein a voltage range for the ESD protection circuit is configurable.

12. The circuit of claim 11, wherein the ESD protection circuit further comprises:
the first diode connected across the input and output of the unity gain buffer connected in a direction to direct an increase voltage towards the output of the unity gain buffer;
the third diode connected from the output of the unity gain buffer to direct an increase voltage to the ground, wherein the third diode comprises the plurality of diodes connected in the same direction;
the second diode connected across the input and the output of the unity gain buffer in a direction to direct a decrease voltage towards the output of the unity gain buffer; and
the fourth diode connected from the output of the unity gain buffer to direct a decrease voltage to the ground, wherein the fourth diode comprises the plurality of diodes connected in the same direction.

13. The circuit of claim 11, wherein:
the third diode includes fifth and sixth diodes, an anode of the fifth diode being directly connected to the output of the unity gain buffer and a cathode of the sixth diode being connected to the ground; and
the fourth diode includes seventh and eighth diodes, an anode of the seventh diode being connected to the ground and a cathode of the eighth diode being directly connected to the output of the unity gain buffer.

14. A low leakage electrostatic discharge (ESD) circuit for a capacitive bio-sensor comprising:
a unity gain buffer;
an ESD protection circuit connected to the unity gain buffer, wherein the ESD protection circuit comprises a first diode and a second diode connected across an input and an output of the unity gain buffer; and
an electrode connected to the input of the unity gain buffer, wherein the electrode is a non-contact electroencephalography (EEG) sensor or a non-contact electrocardiography (ECG) sensor;
wherein an anode of the first diode and a cathode of the second diode are directly connected to the electrode;
wherein:
a cathode of a third diode being connected to a first non-ground reference potential and an anode of a fourth diode being connected to a second non-ground reference potential, and an anode of the third diode and a cathode of the fourth diode being directly connected to the output of the unity gain buffer; and
wherein a voltage range for the ESD protection circuit is configurable.

15. The circuit of claim 14, wherein the ESD protection circuit further comprises:
the first diode connected across the input and output of the unity gain buffer connected in a direction to direct an increase voltage towards the output of the unity gain buffer;
the third diode connected from the output of the unity gain buffer to direct an increase voltage to the first non-ground reference potential;
the second diode connected across the input and the output of the unity gain buffer in a direction to direct a decrease voltage towards the output of the unity gain buffer; and
the fourth diode connected from the output of the unity gain buffer to direct a decrease voltage to the second non-ground reference potential.

* * * * *